(12) United States Patent
Chow

(10) Patent No.: US 6,670,829 B1
(45) Date of Patent: Dec. 30, 2003

(54) ISOLATING CIRCUIT FOR P/N TRANSMISSION GATE DURING HOT-PLUG INSERTION

(75) Inventor: Arnold Chow, Sunnyvale, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/064,487

(22) Filed: Jul. 19, 2002

(51) Int. Cl.7 .......................................... H03K 19/0175
(52) U.S. Cl. ............................. 326/83; 326/81; 326/27
(58) Field of Search ............................. 326/80, 81, 82, 326/83, 26, 27, 89, 90; 327/534, 535

(56) References Cited

U.S. PATENT DOCUMENTS

| | | | |
|---|---|---|---|
| 5,319,259 A | 6/1994 | Merrill | 307/443 |
| 5,646,809 A | 7/1997 | Motley et al. | 361/56 |
| 5,852,370 A | 12/1998 | Ko | 326/81 |
| 5,963,080 A | * 10/1999 | Miske et al. | 327/534 |
| 6,034,553 A | 3/2000 | Kwong | 326/86 |
| 6,052,019 A | 4/2000 | Kwong | 327/437 |
| 6,100,719 A | * 8/2000 | Graves et al. | 326/86 |
| 6,268,759 B1 | 7/2001 | Graves | 327/437 |
| 6,320,408 B1 | 11/2001 | Kwong | 326/31 |

* cited by examiner

*Primary Examiner*—Don Le
(74) *Attorney, Agent, or Firm*—Stuart T. Auvinen

(57) ABSTRACT

A bus switch has a p-channel and an n-channel transistor in parallel between two buses. When power is disconnected to the bus switch, and one bus is hot and has a voltage above ground, this higher voltage is conducted to the gate and substrate of the p-channel transistor. This biasing keeps the p-channel transistor turned off. A gate connecting p-channel transistor connects the hot bus to the p-channel gate node, while a substrate connecting p-channel transistor connects the hot bus to the substrate under the p-channel transistor. A third connecting p-channel transistor connects the hot bus to a power-down node. The power-down node is normally driven low through a delay line when power is applied. The power-down node is applied to the gate of a source transistor that connects power to the substrate and to an inverter that normally drives the p-channel gate node.

20 Claims, 5 Drawing Sheets

3v → 2v

3v → 3v

ISOLATING CIRCUIT FOR P/N TRANSMISSION GATE DURING HOT-PLUG INSERTION

BACKGROUND OF INVENTION

This invention relates to hot plugging isolation circuits, and more particularly to control circuits for bus switches for live insertion when the bus switch is powered down.

High-speed communication systems often are used to connect computer users together. Networks allow users to share data and work cooperatively.

At a physical level, these networks have cables that connect together user's stations, and these cables are in turn connected together using relays or switches. Traditional electromechanical relays are being replaced by solid-state relays and transmission-gate bus switches.

Bus switches are semiconductor integrated circuits (IC's) that use metal-oxide semiconductor (MOS) transistors to make or break the connection. Several switches may be combined on a single silicon die. One such device is made by the assignee and marketed as the P15C3861 Bus Switch. More background on bus switches can be found in Parallel Micro-Relay Bus Switch for Computer Network Communication with Reduced Crosstalk and Low On-Resistance using Charge Pumps, U.S. Pat. No. 5,808,502, also "Bus Switch Having Both P- and N-Channel Transistors for Constant Impedance Using Isolation Circuit for Live-Insertion when Powered, U.S. Pat. No. 6,034,553.

FIG. 1 shows a prior-art bus switch device. N-channel transistor 10 conducts current from its drain to its source, connecting signal lines from two buses when an enable signal is applied to the gate of n-channel transistor 10. Bus switches are usually large in size to allow a large amount of current to flow, and to provide a low on resistance.

While such an NMOS bus switch is effective for 5-volt systems, newer 3-volt systems have lower noise margins. When the gate of n-channel transistor 10 is driven to the 3-volt power supply, a voltage drop of a threshold voltage occurs across the channel. Thus a 3-volt signal applied to the drain of transistor 10 is degraded to a 2-volt signal at its source. Other devices on the bus may require TTL input-voltages. These TTL devices require a high voltage of at least 2.0 volts, leaving no noise margin for voltage drops across the bus.

Future reductions in supply voltage may make the use of simple NMOS bus switches impossible. One solution is to use a charge pump or DC—DC converter to generate a boosted voltage above the 3-volt supply, and to apply this boosted voltage to the gate of the NMOS bus switch. Such DC—DC converters draw current and may not be able to meet speed requirements.

A p-channel transistor can be connected in parallel to the n-channel transistor to form a complementary metal-oxide-semiconductor (CMOS) bus switch. FIG. 2 shows p-channel transistor 12 connected in parallel with n-channel transistor 10 to form a CMOS bus switch. An enable signal is applied to the gate of n-channel transistor 10. An inverter generates the inverse of the enable signal, which is applied to the gate of p-channel transistor 12. Thus both transistors 10, 12 are enabled or disabled at the same time.

A CMOS bus switch does not develop a voltage drop across the source and drain terminals, even when reduced power supplies are used. For high signals when n-channel transistor 10 becomes saturated, p-channel transistor 12 is still in the linear region of operation and thus passes a full 3-volt signal across its channel without the threshold-voltage drop experienced by an n-channel transistor.

FIG. 3 shows the on-resistance across NMOS and CMOS bus switches. On-resistance 16 from source to drain through the transistor's channel varies with the drain voltage for the NMOS bus switch. On-resistance 16 rises sharply as the saturation voltage is reached. In contrast, on-resistance 14 for the CMOS bus switch is relatively constant for all drain voltages, since the p-channel transistor becomes more conductive to compensate for the n-channel transistor becoming less conductive as the drain voltage is increased.

Live Insertion FIG. 4

Modern networking equipment is often reconfigured. It is desirable to add network boards or cards to a backplane bus without powering down the bus and thus shutting down the network. This is known as hot insertion or live insertion. FIGS. 4A–4C illustrate live insertion.

In FIG. 4A, hot bus 20 is a network bus such as a backplane bus in a chassis or equipment rack. Hot bus 20 is powered up and active, having signals in high and low states. These signals may be changing rapidly during the insertion sequence.

A network card is to be inserted into a slot in the chassis, and a connector on the card is to be plugged into a connector on the chassis connected to hot bus 20. The network card includes interface circuitry 22 and bus switch 18. Since no power has yet been applied to the network card, both interface circuitry 22 and bus switch 18 are powered down, with their power supply $V_{DD}$ floating or grounded at 0 volts.

In FIG. 4B, the network card has been inserted into the chassis, and the connectors plugged together. Bus switch 18 is electrically connected to hot bus 20. Bus switch 18 must electrically isolate hot bus 20 from interface circuitry 22, even though power has not yet been applied to interface circuitry 22 or even to bus switch 18.

In FIG. 4C, the inserted network card is powered up. The card's internal power supply $V_{DD}$ reaches 3 volts in a few milliseconds after plugging the card into the connector. However, during these few milliseconds, hot bus 20 must be isolated from interface circuitry 22 by bus switch 18; otherwise the signals on hot bus 20 can be disturbed. Data on hot bus 20 can be lost since high data rates use only a few microseconds or nanoseconds for each data transfer.

Once powered up, interface circuitry 22 can connect to hot bus 20 by enabling switch 18. An enable signal is generated by control logic in interface circuitry 22 or other logic on the inserted network card.

NMOS bus switches are ideal for live-insertion applications, since n-channel transistors do not conduct when their gates are grounded. The drains of n-channel transistors can be directly connected to the hot bus since the p-type substrates are also grounded, preventing the forward-biasing of any p-n junctions.

CMOS bus switches pose several problems for live insertion since p-channel transistors conduct current when their gates are grounded. FIG. 5 shows how a p-channel transistor in a CMOS bus switch can latch up during live insertion. During live insertion, as shown in FIG. 4B, the hot bus has some high signals while the interface circuitry and the bus switch are powered down. Most or all signals in powered-down circuitry is at zero volts, even when floating.

Thus the hot-bus side of the CMOS bus switch can be high, at 3 volts, while the other side is powered-down at ground. While n-channel transistor 10 does not conduct since its gate is also at ground, p-channel transistor 12 can conduct current from hot bus 20 when its gate is at ground. Even as the bus switch is powered up, p-channel transistor 12 can continue conducting current from the hot bus until its gate reaches 2 or 3 volts.

An even more serious problem is that the drain of p-channel transistor 12 can initiate latch up. The p+ drain is connected to the hot bus, which may be high at 3 volts. The N-well under p-channel transistor 12 is grounded when powered down. The P+ drain-to-N-well diffusions form a p-n diode that is forward biased. Since the N-well is rather large with many capacitances, it may be slow to power up to 3 volts. Thus latch up can occur during power up of CMOS bus switches. Even if latch up is not fully developed during power up, the forward biased p-n junction can discharge the hot bus. Additionally, when power is disconnected, these diodes pull the bus to one diode drop above ground, interfering with the normal operation of the hot bus.

The hot bus can be disturbed, causing data loss, when current is connected through p-channel transistor 12, or through the forward-biased p-n junction. Thus CMOS bus switches are difficult to use in live insertion applications.

What is desired is to use a CMOS bus switch for hot-plug or live insertion applications. It is desired to use a CMOS bus switch that is powered down for insertion into a hot, live bus without disturbing the hot bus. A self-isolating CMOS bus switch that isolates even without power being applied is desired.

DETAILED DESCRIPTION

The present invention relates to an improvement in hot-plug bus isolation. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The gate of the p-channel transistor should be driven with the highest available voltage to shut off the p-channel transistor. Likewise, the bulk terminal or N-well under the p-channel transistor should also be driven with the highest available voltage. The highest available voltage is not the internal power supply when the device is powered down; instead, the source or drain of the bus switch connected to the hot bus is likely to be the highest voltage.

N-well technology is often used for the bus switch rather than P-well technology. This allows the N-well under the p-channel transistor to be isolated from other p-channel transistors on the chip. Rather than simply connect the N-well to the power supply, the N-well is driven by a substrate-isolation circuit. The gate and substrate driver circuits can be combined into an integrated circuit block rather than use separate circuits for driving the gate and the substrate.

Figure 1:
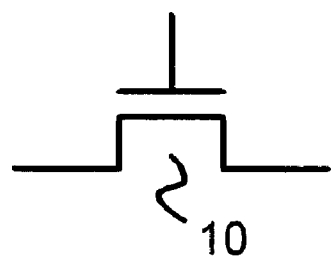
FIG. 1 shows a prior-art bus switch device.
Figure 2:
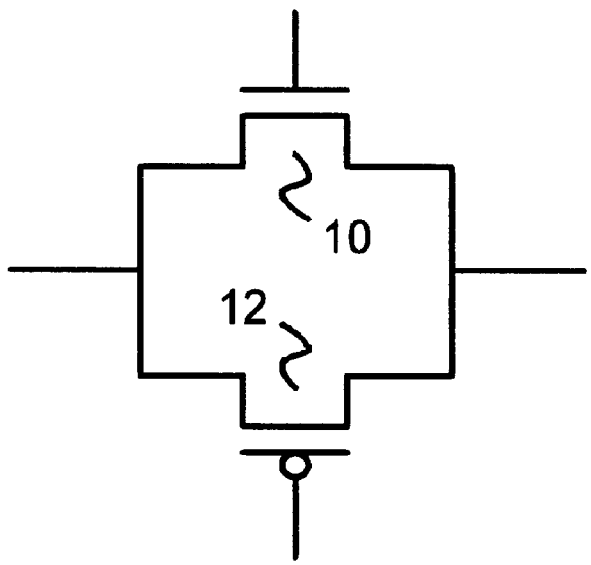
FIG. 2 shows a p-channel transistor connected in parallel with an n-channel transistor to form a CMOS bus switch.
Figure 3:
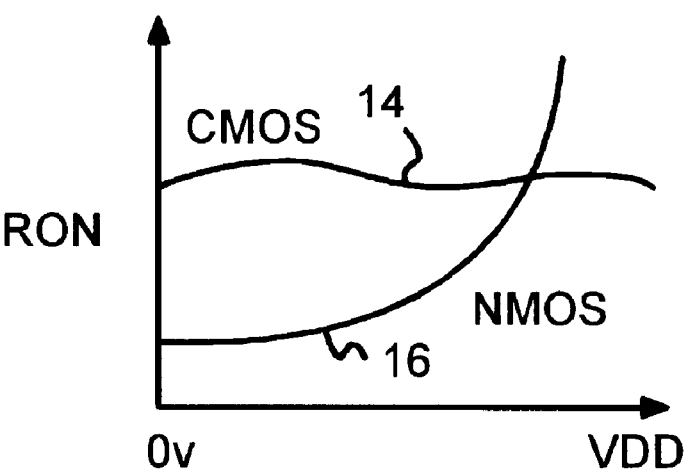
FIG. 3 shows the on-resistance across NMOS and CMOS bus switches.
Figure 4A:
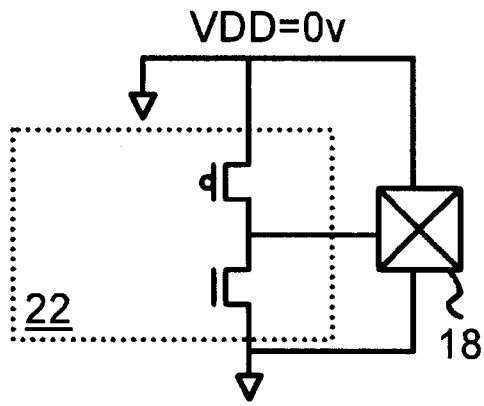
FIGS. 4A–4C illustrate hot plugging or live insertion.
Figure 4B:
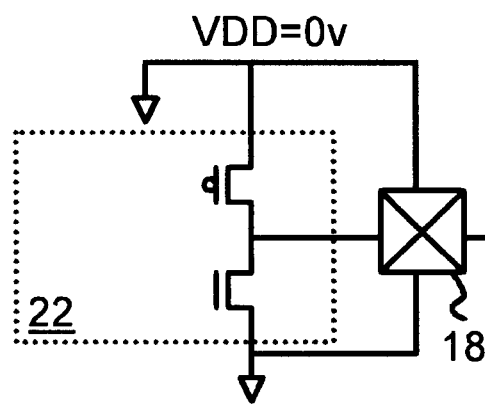
Figure 4C:
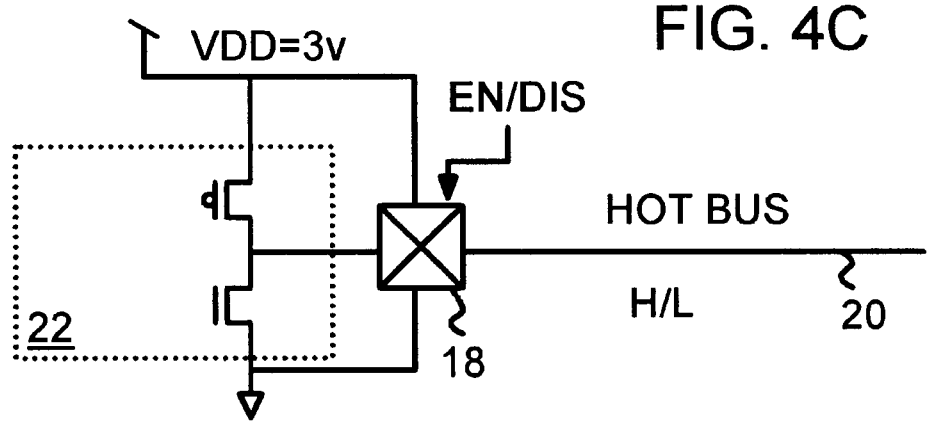
Figure 5:
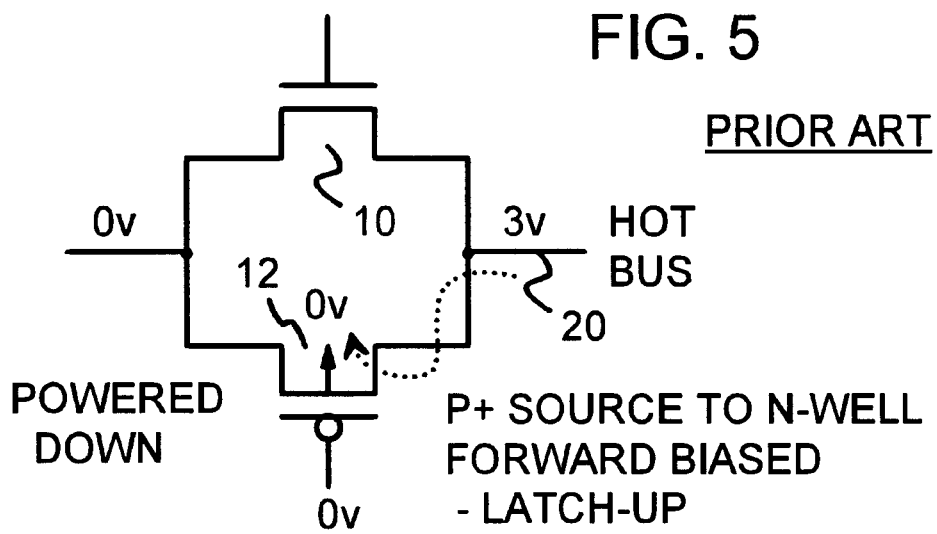
FIG. 5 shows how a p-channel transistor in a CMOS bus switch can latch up during live insertion.
Figure 6:
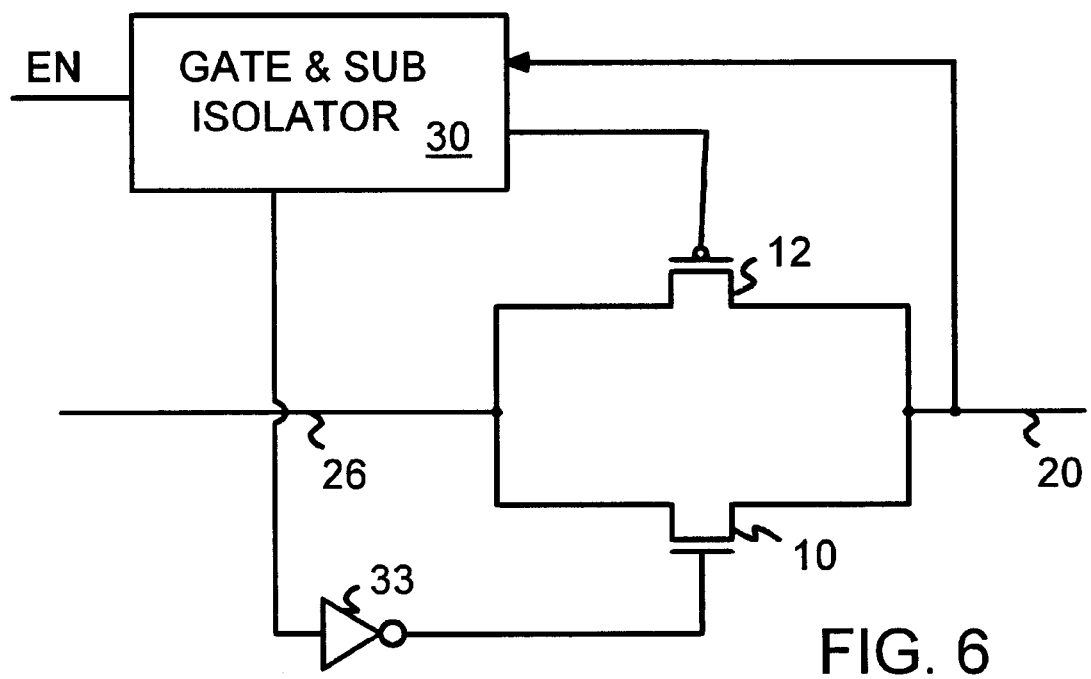
FIG. 6 is a diagram of a CMOS bus switch with an integrated gate and substrate isolation circuit.

FIG. 6 is a diagram of a CMOS bus switch with an integrated gate and substrate isolation circuit. The bus switch has n-channel transistor 10 and p-channel transistor 12 in parallel as a transmission gate between hot bus 20 and a second bus 26 that may or may not be powered up. Enable signal EN is buffered through gate and substrate isolation circuit 30 and inverter 33 and applied to the gate of n-channel transistor 10. The inverse of enable EN is also applied to the gate of p-channel transistor 12 through gate and substrate isolation circuit 30 when the device is powered up.

When power is off, enable signal EN is floating, and the gate of n-channel transistor 10 is also floating since inverter 33 has no power. Since charge leaks off after a period of time, it is likely that the gate of n-channel transistor 10 is at ground when powered off. Thus n-channel transistor 10 does not conduct current from hot bus 20 to second bus 26 when powered off, regardless of the voltages on hot bus 20 and second bus 26.

P-channel transistor 12 would otherwise conduct current from hot bus 20 to second bus 26 when powered down. Anytime that a high voltage is on hot bus 20, a negative gate-to-source voltage develops on p-channel transistor 12 if its gate were grounded. Instead, gate and substrate isolation circuit 30 applies the hot-bus voltage to the gate of p-channel transistor 12. When hot bus 20 is at a high voltage, this same high voltage is applied to the gate of p-channel transistor 12 by gate and substrate isolation circuit 30. Thus p-channel transistor 12 is shut off, presenting a high impedance to hot bus 20.

The substrate or N-well under p-channel transistor 12 must also be driven with the highest available voltage. Gate and substrate isolation circuit 30 applies the hot-bus voltage to the N-well under p-channel transistor 12. This puts the substrate and the p+ drain at the same voltage, preventing the p-n junction from being forward biased.

When the bus switch is powered up, gate and substrate isolation circuit 30 applies $V_{DD}$ from the internal power supply to the N-well, and applies the inverse enable to the gate of p-channel transistor 12. Gate and substrate isolation circuit 30 can surprisingly operate without power, even when the internal power supply is grounded or floating.

Figure 7:
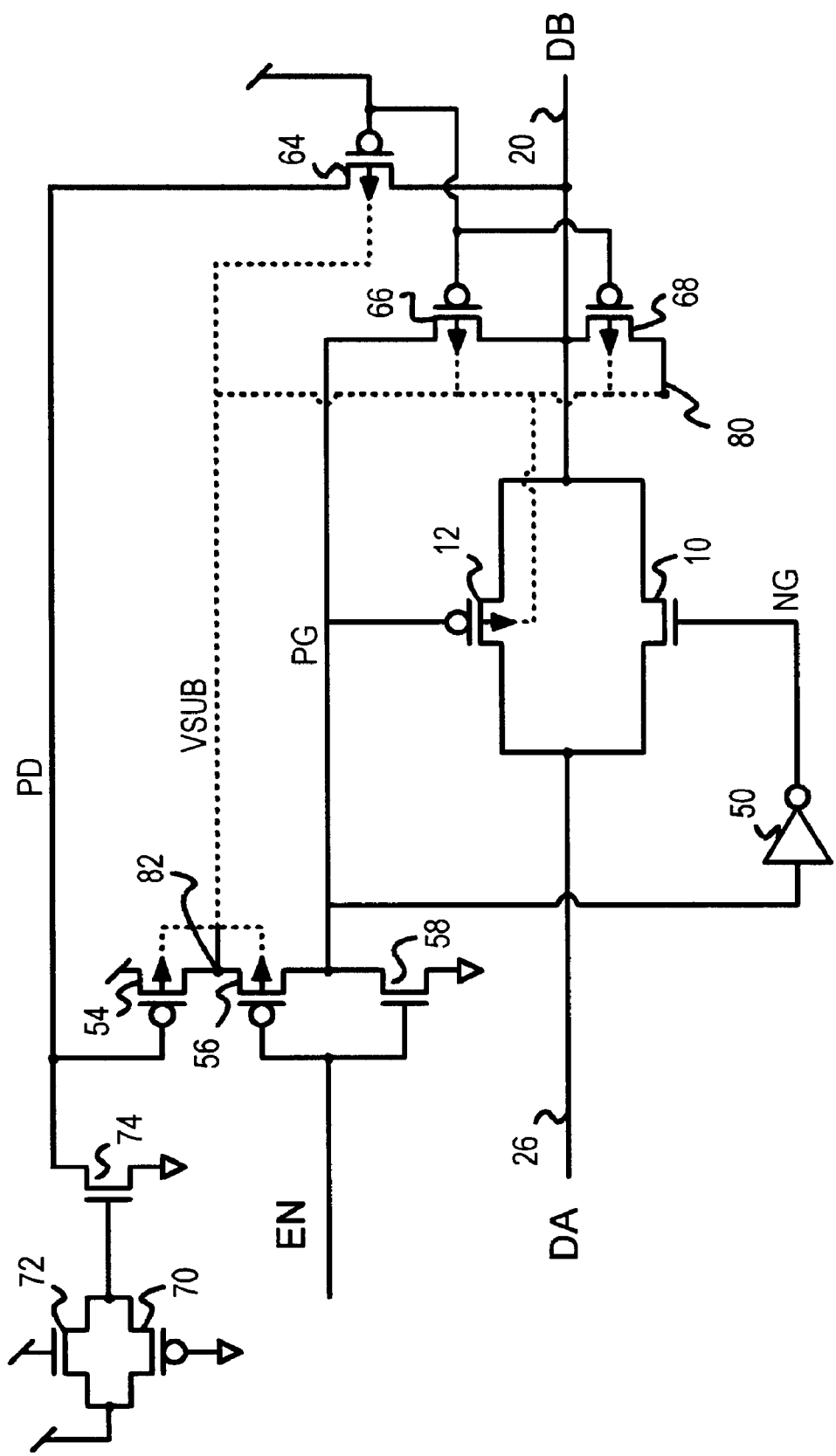
FIG. 7 is a detailed schematic of a gate and substrate isolation circuit that operates without power.

FIG. 7 is a detailed schematic of a gate and substrate isolation circuit that operates without power. P-channel transistor 12 connects hot bus 20 (DB) to second bus 26 (DA) when power is applied and enable EN is high. N-channel transistor 10 in parallel with p-channel transistor 12 also conducts when enable EN is high. The size (W/L) of the p-channel transistor is typically 2–4 times the size (W/L) of the n-channel transistor to account for the lower hole mobility.

When power is applied, the power connection to the source/drain of delay transistors 70, 72 drives high the gate of n-channel pull-down transistor 74, which drives line PD low. Since power-down signal PD is applied to the gate of p-channel source transistor 54, transistor 54 remains on when power is applied.

Source transistor 54 connects power to the source of p-channel inverting transistor 56, which forms an inverter with n-channel inverting transistor 58. Enable EN is inverted by inverting transistors 56, 58 to drive p-gate node PG, which is the gate of p-channel bus-switch transistor 12. Inverter 50 inverts PG to drive n-gate node NG, which is the gate of n-channel bus-switch transistor 10.

The gates of p-channel connecting transistors 64, 66, 68 are each connected to power. Thus transistors 64, 66, 68 remain off when power is applied.

The N-well or substrate under p-channel transistors 12, 54, 56, 64, 66, 68 is connected to node VSUB, shown by the dashed lines. Node VSUB is driven by drain 82 between inverting transistor 56 and source transistor 54. When power is on, node PD is low, and source transistor 54 drives substrate node VSUB with power Vdd.

When the bus switch chip is powered down, all $V_{DD}$ connections are essentially grounded. N-channel delay transistor 72 does not conduct since its gate is connected to $V_{DD}$, which is ground at power-down. Since the source of delay transistors 70, 72 is no longer powered, a low signal is conducted through p-channel delay transistor 72 to the gate of pull-down transistor 74. Transistor 74 turns off after some delay from power-off, causing power-down node PD to float.

P-channel connecting transistors 64, 66, 68 all conduct, since their gates are connected to $V_{DD}$, which is low at power down. Transistors generally behave in the opposite manner once power is disconnected: the p-channel transistors conduct while the n-channel transistors do not conduct.

When power is off and hot bus 20 is at least a threshold above ground, connecting transistor 64 turns on, since its gate (ground) is lower than its source (hot-bus 20 voltage). Connecting transistor 64 then drives power-down node PD with the higher hot-bus voltage. This higher voltage on node PD is applied to the gate of source transistor 54, keeping it off and isolating substrate (N-well) node VSUB from the Vdd power bus.

Substrate connecting transistor 68 can also turn on, as its gate (ground) is also below its source (hot-bus 20's voltage above ground). Substrate connecting transistor 68 drives the substrate node VSUB with the hot-bus voltage through drain connection 80, which can be one or more metal straps, taps, or other conducting connections to the N-well under p-channel transistors 12, 54, 56, 64, 66, 68.

When power is off, n-channel inverting transistor 58 remains off, and p-channel inverting transistor 56 may be on or off. If inverting transistor 56 turns on, it connects substrate node VSUB to gate node PG. Otherwise, its isolates PG from VSUB.

Gate node PG is driven with the higher hot-bus voltage through gate connecting transistor 66. Gate connecting transistor 66 can turn on during hot plug, as its gate (ground) is also below its source (hot-bus 20's voltage above ground). Gate connecting transistor 66 drives the P-gate node PG with the hot-bus voltage when hot bus 20 is more than a threshold above ground.

P-channel bus-switch transistor 12 remains off, isolating hot bus 20 from second bus 26, since its gate and substrate are driven with the higher hot-bus voltage. Even when some voltage drop occurs across conducting transistors 64, 66, 68, the gate substrate of transistor 12 should be sufficiently biased to prevent turn on or significant leakage.

Figure 8:
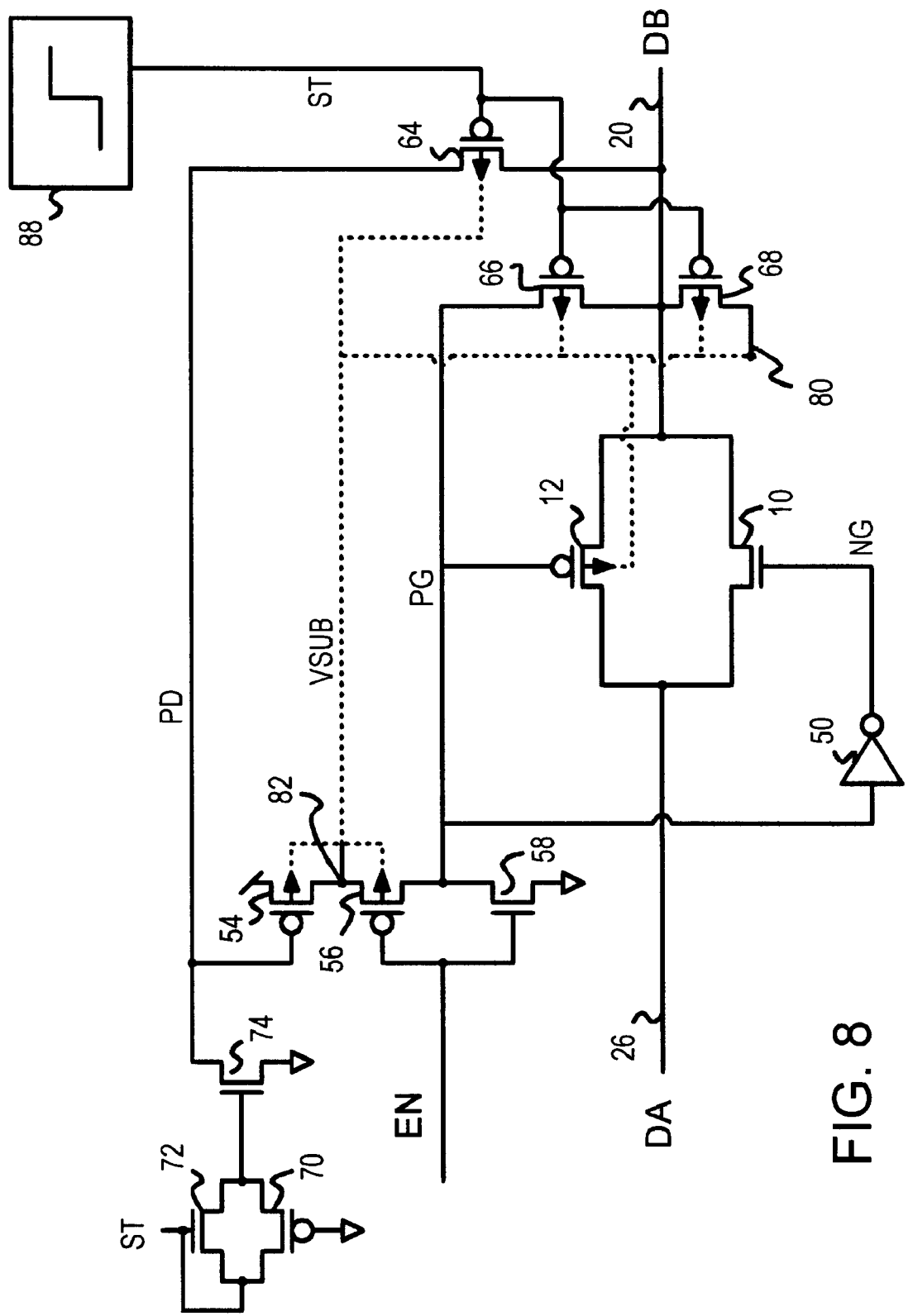
FIG. 8 shows an alternate embodiment of a bus switch and gate and substrate isolation circuit.

FIG. 8 shows an alternate embodiment of a bus switch and gate and substrate isolation circuit. As power is gradually ramped up, the internal power supply Vdd rises from ground to 3 volts. Power-up circuit 88 generates signal ST which it tripped by a pre-determined voltage such as Vdd/2 and rises more sharply than Vdd to give more distinct state switching.

State signal ST is applied to the gates of p-channel connecting transistors 64, 66, 68. Once power is on and state signal ST has been driven high, connecting transistors 64, 66, 68 turn off. Using power-up circuit 88 can allow connecting transistors 64, 66, 68 to remain on somewhat longer, providing hot-plug protection for a longer period of time including part of the powering time.

State signal ST can also be applied to the gate and drain of n-channel delay transistor 72. This further delays de-activation of the isolation circuit when power is turned on, since pull-down transistor 74 is not activated until power-up circuit 88 drives state signal ST high. Otherwise, operation of the circuit is similar to that described for FIG. 7.

ALTERNATE EMBODIMENTS

Several other embodiments are contemplated by the inventor. Another inverter be added to the enable signal path when an inverse-enable or isolation signal is available. Delay p-channel transistor 70 may also have its substrate connected to node VSUB or it may use another connection to Vdd. Sub-threshold conduction of the connecting transistors can also be useful to bias the substrate and p-gate nodes. Additional transistors, capacitors, resistors, and other devices can be added, such as to increase delay at power-on or to provide bi-directional hot-bus sensing. The terms source and drain can be considered interchangeable and can be reversed as biases change.

The invention is also useful for live removal, where a card is powered down and pulled out of the system. The invention has been described for live insertion of network cards, but other live insertion applications such as computer cards can benefit from the invention. Although only one bit of busses and the bus switch have been shown, many applications use a multi-bit-wide bus. The bus switch and its isolation circuit are simply replicated for each bit of the bus, although common enable signals can be used.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A bus switch comprising:

a first bus;

a second bus;

an enable signal for indicating when the first bus is to be connected to the second bus;

an n-channel bus-switch transistor for conducting current between the first and second bus in response to the enable signal;

a p-channel bus-switch transistor for conducting current between the first and second bus in response to the enable signal, the p-channel bus-switch transistor having a gate node and a substrate node;

a first connecting transistor coupled to conduct current from the second bus to the gate node when power is disconnected from the bus switch and the second bus is powered above ground;

a second connecting transistor coupled to conduct current from the second bus to the substrate node when power is disconnected from the bus switch and the second bus is powered above ground;

a third connecting transistor coupled to conduct current from the second bus to an activating node when power is disconnected from the bus switch and the second bus is powered above ground; and a source transistor, having a gate driven by the activating node, for conducting current from a power supply to the substrate node when power is connected, but for isolating the substrate node from the power supply when power is disconnected from the bus switch, whereby the p-channel bus-switch transistor is biased to isolate the first bus from the second bus when power is disconnected from the bus switch and the second bus is powered above ground.

2. The bus switch of claim 1 further comprising:

a first inverting transistor, having a gate driven by the enable signal and coupled to conduct current from the substrate node to the gate node;

a second inverting transistor, having a gate driven by the enable signal and coupled to conduct current from the gate node to a ground node.

3. The bus switch of claim 2 wherein the first inverting transistor is a p-channel transistor and the second inverting transistor is a n-channel transistor.

4. The bus switch of claim 3 further comprising:

an inverter coupled between the gate node and a gate of the n-channel bus-switch transistor.

5. The bus switch of claim 4 further comprising:

a pull-down transistor coupled to conduct current from the activating node to the ground node when power is connected to the bus switch.

6. The bus switch of claim 5 further comprising:

a delay line that drives a high voltage to a gate of the pull-down transistor after power is connected to the bus switch.

7. The bus switch of claim 6 wherein the delay line comprises:

a delay p-channel transistor for driving the gate of the pull-down transistor;

a delay n-channel transistor in parallel with the delay p-channel transistor for driving the gate of the pull-down transistor.

8. The bus switch of claim 7 wherein a gate of the delay p-channel transistor is coupled to the ground node;

wherein a gate of the delay n-channel transistor is coupled to the power supply or to a state node that is driven high after a delay when power is connected to the bus switch.

9. The bus switch of claim 8 wherein gates of the first, second, and third connecting transistors are coupled to the power supply or to a state node that is driven high after a delay when power is connected to the bus switch.

10. The bus switch of claim 2 wherein the first, second, and third connecting transistors are p-channel transistors.

11. The bus switch of claim 10 wherein the substrate node includes one or more N-wells under the p-channel bus-switch transistor, the first, second, and third connecting transistors, the first inverting transistor and the source transistor.

12. A bus-switch circuit comprising:

a p-channel bus-switch transistor having a source coupled to a first signal line, a drain coupled to a second signal line, and a gate driven by a p-gate node, and a bulk terminal coupled to a well node;

an n-channel bus-switch transistor having a source coupled to the first signal line, a drain coupled to the second signal line, and a gate driven by an n-gate node;

a first connecting transistor having a gate driven by a state node, a source coupled to the second signal line, and a drain coupled to the p-gate node;

a second connecting transistor having a gate driven by the state node, a source coupled to the second signal line, and a drain coupled to the well node;

a third connecting transistor having a gate driven by the state node, a source coupled to the second signal line, and a drain coupled to a power-down node;

a source transistor having a source coupled to a power supply, a drain coupled to the well node, and a gate coupled to the power-down node;

a first inverting transistor having a source coupled to the well node and the source transistor, a drain driving the p-gate node, and a gate coupled to an enable input;

a second inverting transistor having a source coupled to a ground, a drain driving the p-gate node, and a gate coupled to the enable input;

an inverter having an input coupled to the p-gate node and an output driving the n-gate node.

13. The bus-switch circuit of claim 12 further comprising:

a pull-down n-channel transistor having a drain coupled to the power-down node and a source coupled to the ground;

a delay p-channel transistor having a gate coupled to the ground and a source coupled to the state node and a drain coupled to a gate of the pull-down n-channel transistor;

a delay n-channel transistor having a gate coupled to the state node and a source coupled to the state node and a drain coupled to the gate of the pull-down n-channel transistor.

14. The bus-switch circuit of claim 13 wherein the state node is coupled to the power supply.

15. The bus-switch circuit of claim 13 further comprising:

a power-on circuit, coupled to the power supply, for driving the state node high after a delay once power is applied.

16. The bus-switch circuit of claim 12 wherein the first, second, and third connecting transistors are p-channel transistors.

17. The bus-switch circuit of claim 12 wherein the first, second, and third connecting transistors have bulk terminals connected to the well node.

18. The bus-switch circuit of claim 17 wherein the source transistor and the first inverting transistor are p-channel transistors with bulk terminals connected to the well node;
wherein the second inverting transistor is an n-channel transistor.

19. An isolating circuit comprising:
input means for connecting to a first signal and a second signal;
enable signal means for indicating when the first signal is to be connected to the second signal;
n-channel isolation transistor means for conducting current between the first and second signal in response to an n-gate;
p-channel isolation transistor means for conducting current between the first and second signal in response to a p-gate, the p-channel isolation transistor means having a N-well;
first connecting transistor means for conducting current from the second signal to the p-gate when power is disconnected from the isolating circuit and the second signal is powered above ground;
second connecting transistor means for conducting current from the second signal to the N-well when power is disconnected from the isolating circuit and the second signal is powered above ground;
third connecting transistor means for conducting current from the second signal to an activating signal when power is disconnected from the isolating circuit and the second signal is powered above ground; and
source transistor means, having a gate driven by the activating signal, for conducting current from a power supply to the N-well when power is connected, but for isolating the N-well from the power supply when power is disconnected from the isolating circuit,
p-channel inverting transistor means, coupled to the enable signal means, for conducting current from the source transistor means to the p-gate;
n-channel inverting transistor means, coupled to the enable signal means, for conducting current from the p-gate to a ground;
inversion means, coupled to the p-gate, for driving the n-gate from the p-gate.

20. The isolating circuit of claim 19 further comprising:
power-up means for driving to a power-supply voltage gates of the first, second, and third connecting transistor means when power is applied, but for grounding gates of the first, second, and third connecting transistor means when power is not applied.

* * * * *